(12) United States Patent
Kawabata et al.

(10) Patent No.: US 7,948,081 B2
(45) Date of Patent: May 24, 2011

(54) CARBON NANOTUBE STRUCTURE, A SEMICONDUCTOR DEVICE, A SEMICONDUCTOR PACKAGE AND A MANUFACTURING METHOD OF A SEMICONDUCTOR DEVICE

(75) Inventors: Akio Kawabata, Kawasaki (JP); Mizuhisa Nihei, Kawasaki (JP); Masahiro Horibe, Tsukuba (JP)

(73) Assignee: Fujitsu Limited, Kawasaki (JP)

( * ) Notice: Subject to any disclaimer, the term of this patent is extended or adjusted under 35 U.S.C. 154(b) by 197 days.

(21) Appl. No.: 11/041,891

(22) Filed: Jan. 25, 2005

(65) Prior Publication Data

US 2006/0071334 A1    Apr. 6, 2006

(30) Foreign Application Priority Data

Oct. 5, 2004    (JP) .................................. 2004-292843

(51) Int. Cl.
*H01L 23/52* (2006.01)
(52) U.S. Cl. . 257/741; 257/698; 257/774; 257/E33.073; 257/E29.139; 257/E51.04; 977/833; 977/936
(58) Field of Classification Search .................... 257/741
See application file for complete search history.

(56) References Cited

U.S. PATENT DOCUMENTS

| | | | | |
|---|---|---|---|---|
| 5,818,700 A * | 10/1998 | Purinton | .................... | 361/760 |
| 6,297,063 B1 * | 10/2001 | Brown et al. | .................... | 438/2 |
| 6,333,598 B1 * | 12/2001 | Hsu et al. | .................... | 313/495 |
| 6,856,016 B2 * | 2/2005 | Searls et al. | .................... | 257/720 |
| 6,987,320 B2 * | 1/2006 | Miyachi et al. | .................... | 257/746 |
| 7,135,773 B2 * | 11/2006 | Furukawa et al. | .................... | 257/758 |
| 7,300,860 B2 * | 11/2007 | Dubin | .................... | 438/584 |
| 2003/0179559 A1 * | 9/2003 | Engelhardt et al. | .................... | 361/780 |
| 2004/0152240 A1 * | 8/2004 | Dangelo | .................... | 438/122 |
| 2004/0184241 A1 * | 9/2004 | De Lorenzo et al. | .................... | 361/719 |
| 2005/0285116 A1 * | 12/2005 | Wang | .................... | 257/76 |

FOREIGN PATENT DOCUMENTS

JP    2003-523608    8/2003

OTHER PUBLICATIONS

Hoenlein et al Materials Science and Engineering C 23 (Dec. 2003) pp. 663-669. "Carbon nanotubes . . . prospects".*

* cited by examiner

*Primary Examiner* — Jerome Jackson, Jr.
(74) *Attorney, Agent, or Firm* — Kratz, Quintos & Hanson, LLP

(57) ABSTRACT

A semiconductor device uses a carbon nanotube structure, which reduces an electric resistance and a thermal resistance by increasing a density of the carbon nanotubes. An insulation film covers a first electrically conductive material. A second electrically conductive material is provided on the insulation film. A plurality of carbon nanotubes extend through the insulation film by being filled in an opening part that exposes the first electrically conductive material. The carbon nanotubes electrically connect the first electrically conductive material and the second electrically conductive material to each other. Ends of the carbon nanotubes are fixed to a recessed part provided on a surface of the first electrically conductive material.

18 Claims, 7 Drawing Sheets

CARBON NANOTUBE STRUCTURE, A SEMICONDUCTOR DEVICE, A SEMICONDUCTOR PACKAGE AND A MANUFACTURING METHOD OF A SEMICONDUCTOR DEVICE

BACKGROUND OF THE INVENTION

1. Field of the Invention

The present invention relates to a carbon nanotube structure, a semiconductor device and a semiconductor package and, more particularly, to a semiconductor device equipped with perpendicular wiring parts such as a via or a contact and a semiconductor package equipped with a radiator.

2. Description of the Related Art

Multi-layer wiring structure has been advanced as a number of transistor elements mounted in, for example, a CMOS-type large-scale integrated circuit (LSI) increases with a reduction in a circuit scale of transistor elements and wirings in an LSI so as to satisfy the demand for improvement in high-performance, multi-functionalization and miniaturization.

Under reduction in a circuit size and multi-wiring, a wiring pitch and a cross-sectional area of a via and a contact parallel to a substrate surface are reduced increasingly, and an electric resistance of a via and the like is increased due to the reduction in the cross-sectional area. Moreover, it is known that a volume resistivity of a metal material such as Cu or the like becomes higher than a volume resistivity in a case of bulk as a cross-sectional area is reduced. Accordingly, a wiring resistance of a via and the like increases further, which results in an increase in a wiring delay due to an increase in a CR product. Thus, an effect of miniaturization may be cancelled, and the wiring delay may cause an obstacle to a high-speed transmission.

On the other hand, a carbon nanotube has a cylindrical shape made by winding a single sheet of graphite. A diameter of a carbon nanotube is about several nanometers to ten nanometers, and a length thereof is several micrometers. Therefore, an aspect ratio (length/diameter) of a carbon nanotube is about 1000, and a one-dimensional electronic behavior of the carbon nanotube due to the geometrical anisotropy has attracted attention. A carbon nanotube has a feature that a maximum current density without cut off is one million amperes per one square centimeter, which is more than 100 times larger than that of a copper wire. Additionally, a carbon nanotube has a thermal conductivity 10 times higher than that of copper. In a point of view of the electric resistance, it was reported that electrons flowing through the carbon nanotube can achieve a so-called ballistic electron transportation having no scattering phenomenon due to impurity or lattice vibration (phonon). In such a case, it is known that a resistance of a single carbon nanotube is about 6.45 k$\Omega$.

For example, Japanese Laid-Open Patent Application No. 2003-523608 suggests a wiring structure 100 using a carbon nanotube as a via as shown in FIG. 1 that uses the electric advantage of a carbon nanotube. In the wiring structure shown in FIG. 1, carbon nanotubes 106 are caused to grow in a hole 104 extending through a non-conductive layer 103 provided between a first conductive layer 101 and a second conductive layer 102 from a catalytic layer 105 formed on the first conductive layer 101 so as to electrically connects the first conductive layer 101 and the second conductive layer 102 to each other by the carbon nanotubes 106.

However, with the wiring structure 100 shown in FIG. 1, since the carbon nanotubes 106 grow respectively from only nucleus separated with each other in the catalytic layer 105 on the first conductive layer exposed in the hole 104, there are spaces between adjacent carbon nanotubes 106, which results in a limitation in a density of the carbon nanotubes 106 in a cross section of the hole 104 parallel to the first conductive layer 101. Consequently, there is a problem in that an electric resistance cannot be sufficiently reduced relative to the cross-sectional area of the hole 104.

On the other hand, in a semiconductor package in which an LSI is mounted on a high-density mounting substrate, for example, chip size package (CSP), thermal transportation is carried out by releasing a heat generated by the LSI to an atmosphere through a heat sink made of Al or the like. Although an LSI and a heat sink are usually adhered to each other via a thermally conductive paste, a temperature of the LSI, of which amount of hear generation has been increased due to recent high-integration, is raised during an operation if the thermal resistance is not sufficiently deceased. Thus, there is a problem in that a degradation of reliability occurs such as erroneous operation or reduction in service life.

SUMMARY OF THE INVENTION

It is a general object of the present invention to provide an improved and useful carbon nanotube structure in which the above-mentioned problems are eliminated.

A more specific object of the present invention is to provide a carbon nanotube structure and a semiconductor device or a semiconductor package using the carbon nanotube structure, which reduces an electric resistance and a thermal resistance by increasing a density of a bundle of carbon nanotubes.

In order to achieve the above-mentioned objects, there is provided according to one aspect of the present invention a semiconductor device comprising: a first electrically conductive material; an insulation film covering the first electrically conductive material; a second electrically conductive material provided on the insulation film; and a plurality of carbon nanotubes extending through the insulation film by being filled in an opening part that exposes the first electrically conductive material, the carbon nanotubes electrically connecting the first electrically conductive material and the second electrically conductive material to each other, wherein ends of the carbon nanotubes are fixed to a recessed part provided on a surface of the first electrically conductive material.

According to the present invention, since the carbon nanotubes are fixed along the recessed part of the surface of the first electrically conductive material, a density (a number per unit area) of the carbon nanotubes, which electrically connect between the first electrically conductive material and the second electrically conductive material, is increased in response to an increase in a surface area due to the existence of the recessed part, thereby improving an electric conductivity. Additionally, since a contact area with the carbon nanotubes is increased by providing the recessed part to the first electrically conductive material, a maximum value of a current flowing between the first electrically conductive material and the second electrically conductive material can be increased.

In the semiconductor device according to the present invention, the carbon nanotubes may grow from a catalytic layer covering the recessed part. Accordingly, a density of the carbon nanotubes, which connect the first electrically conductive layer to the second electrically conductive layer, is increased in response to an increase in the surface area due to the configuration of the recessed part since the carbon nanotubes grow from the catalytic layer that covers along the inner surface of the recessed part. Thus, in addition to the above-mentioned effects, a contact resistance between the carbon nanotubes and the first electrically conductive material is reduced and also an adhesion strength is between the carbon nanotubes and the first electrically conductive material is increased due to growth of the carbon nanotubes in a root growth mode.

In the above-mentioned semiconductor device, the recessed part may have a cross section parallel to the surface of the first electrically conductive material and having a configuration selected from a group consisting of a rectangular shape, a V-shape, an elliptic shape, a trapezoidal shape and a reversed trapezoidal shape. The recessed part may have a side surface substantially perpendicular to the surface of the first electrically conductive material.

The above-mentioned semiconductor device may further comprise a barrier film and a Ti film under the between an inner surface of the recessed part and the catalytic layer so as to cover the inner surface of the recessed part. The catalytic layer may be one of a continuous layer and a particulate deposit. The catalytic layer may be made of a material selected from a group consisting of Fe, Ni, Co, Mo, Pd and an alloy containing one of the aforementioned metal and a metal compound containing the metal material and P or N.

In the semiconductor device according to the present invention, an aspect ratio of a length of one side of an opening part of the recessed part to a depth of the recessed part may be set in a range from 0.025 to 10. A ratio Scat/Svia of a surface area Scat of the catalytic layer to an area Svia of a cross section parallel to the surface of the electrically conductive material may be set in a range from 0.05 to 10.

In the semiconductor device according to the present invention, the first electrically conductive material and the second electrically conductive material may be formed of an electrically conductive material selected from Cu, Ti, W, Al, TiN and an alloy containing the aforementioned metal or a stacked film of the aforementioned electrically conductive materials. The first electrically conductive material may be one of a semiconductor substrate and a silicide film formed on a surface of a gate electrode.

Additionally, there is provided according to another aspect of the present invention a semiconductor package comprising: a semiconductor device; a circuit substrate connected to the semiconductor device; and a heat-releasing part provided to a surface of the semiconductor device, wherein the heat-releasing part includes a thermally conductive base material, a plurality of carbon nanotubes arranged on a surface of the thermally conductive base material and an adhesive layer fixing ends of the carbon nanotubes to the semiconductor device, and wherein the carbon nanotubes are fixed to a catalytic layer covering an inner surface of a recessed part provided to the surface of the thermally conductive base material.

According to the above-mentioned invention, since the carbon nanotubes grow from the catalytic layer covering the inner surface of the recessed part of the thermally conductive base material, a density of the carbon nanotubes is increased in response to an increase in the surface are due to existence of the recessed part. Accordingly, a thermal conductivity is extremely improved, and a heat generated by the semiconductor device can be efficiently released outside. Thus, an erroneous operation due to an excessive heat can be prevented, and a reduction in a service life is suppressed, which results in an improvement in reliability.

In the above-mentioned semiconductor package, the carbon nanotubes may grow from the catalytic layer. The adhesive layer may be made of a material selected from a group consisting of Au, Sn and an alloy containing one of the aforementioned material.

Additionally, there is provided according to another aspect of the present invention a carbon nanotube structure comprising: a base material; a catalytic layer covering an inner surface of a recessed part formed on a surface of the base material; and a plurality of carbon nanotubes growing from a surface of the catalytic layer.

According to the above-mentioned invention, since the carbon nanotubes grow from the catalytic layer covering the inner surface of the recessed part of the surface of the base material, a density of the carbon nanotubes is increased in response to an increase in the surface area due to existence of the recessed part. Thus, an electric conductivity and also a thermal conductivity are improved due to the assembly of the carbon nanotubes.

In the above-mentioned carbon nanotube structure, the carbon nanotubes may form a carbon nanotube bundle in which ends of the carbon nanotubes are cohesive with each other.

Additionally, there is provided according to another aspect of the present invention a manufacturing method of a semiconductor device comprising: a first electrically conductive material; an insulation film covering the first electrically conductive material; a second electrically conductive material provided on the insulation film; and a plurality of carbon nanotubes extending through the insulation film by being filled in an opening part that exposes the first electrically conductive material, the carbon nanotubes electrically connecting the first electrically conductive material and the second electrically conductive material to each other, the manufacturing method comprising the steps of: forming an opening part extending through the insulation film and exposing a part of the surface of the first electrically conductive material; forming a recessed part on the surface of the first electrically conductive material, the recessed part being connected to the opening part; forming a catalytic layer covering an inner surface of the recessed part; causing the carbon nanotubes growing from the catalytic layer and filling the opening part; and forming the second electrically conductive material on a surface of the insulation layer so as to cover ends of the carbon nanotubes.

In the above-mentioned manufacturing method of a semiconductor device, the step of forming the recessed part may use one of an ion milling method, an RIE method and a wet etching method.

Other objects, features and advantages of the present invention will become more apparent from the following detailed description when read in conjunction with the accompanying drawings.

DETAILED DESCRIPTION OF THE DRAWINGS

DETAILED DESCRIPTION OF THE PREFERRED EMBODIMENTS

Figure 1:
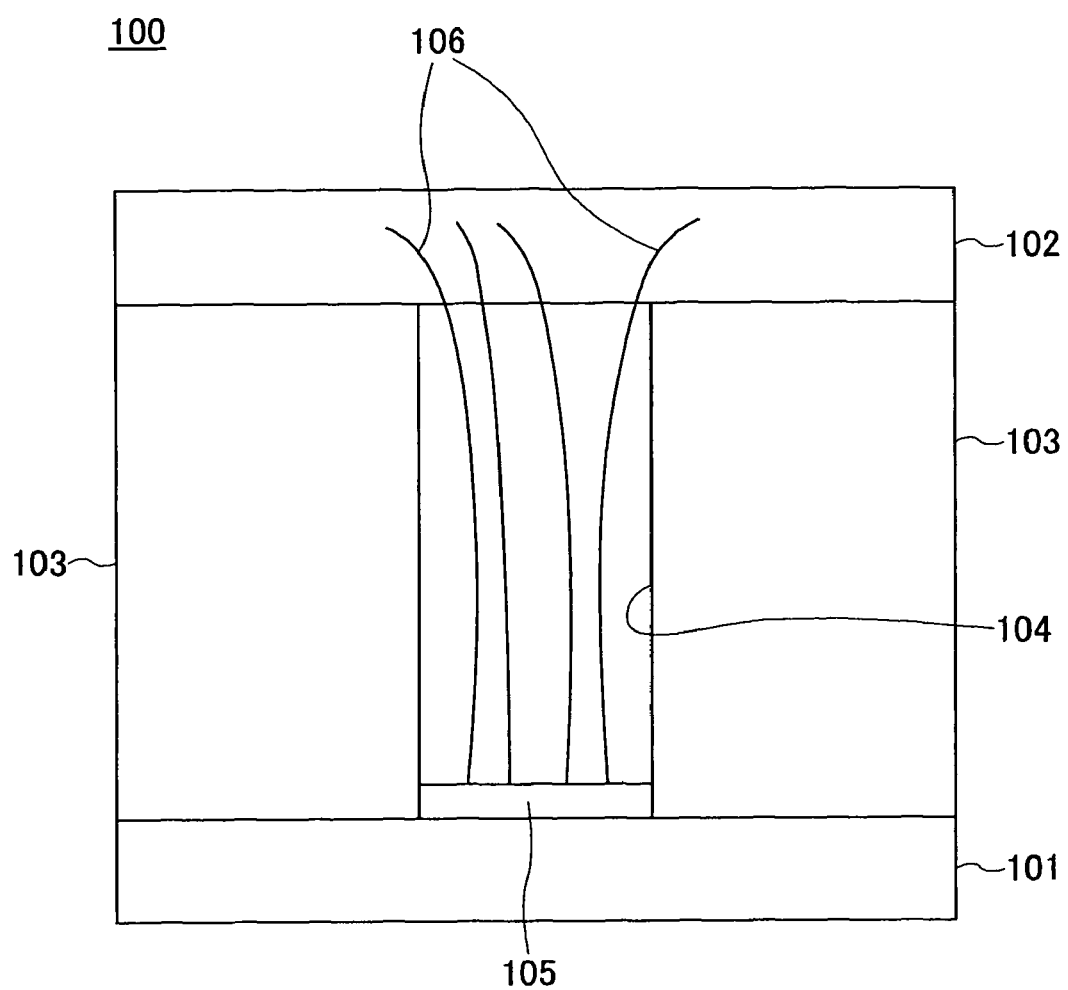
FIG. 1 is a cross-sectional view of a conventional contact.
Figure 2A:
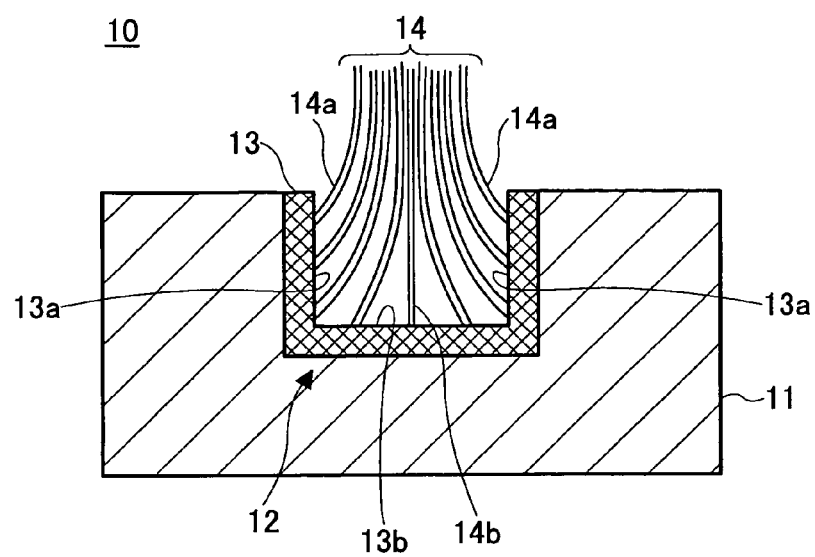
FIG. 2A is an illustration for explaining a principle of the present invention.
Figure 2B:
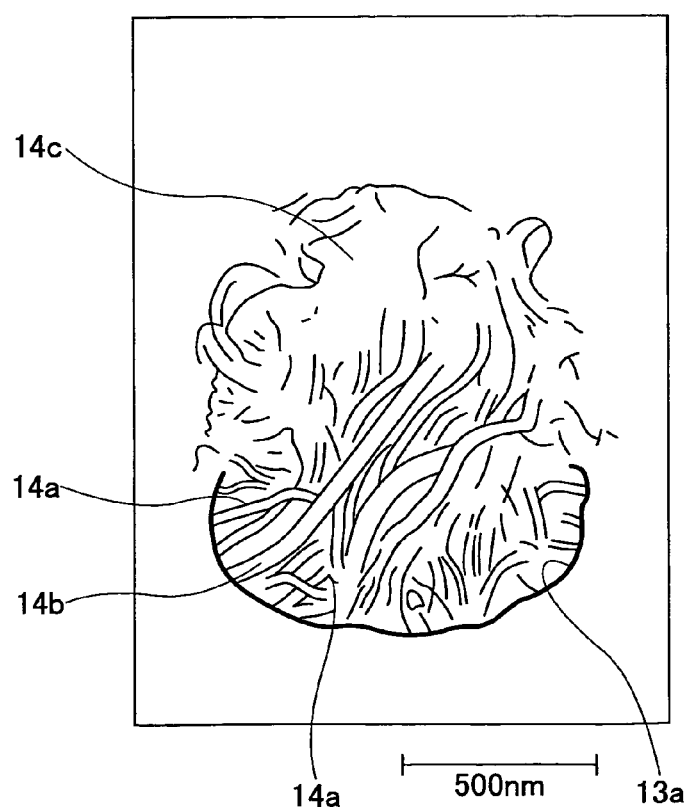
FIG. 2B is an illustration of an SEM photograph of a carbon nanotube structure according to the present invention.

First, a description will be given, with reference to FIGS. 2A and 2B of a principle of the present invention. FIG. 2A is an illustration for explaining the principle of the present invention. FIG. 2B is an illustration of an SEM photograph of a carbon nanotube structure according to the present invention.

With reference to FIGS. 2A and 2B, a catalytic layer 13 was formed on an inner surface of a recessed part 12 formed in a substrate 11 so that the catalytic layer 13 provides nucleus of growth of carbon nanotubes 14a. Then, the carbon nanotubes 14 were caused to grow by chemical vapor deposition (CVD) from the surface of the catalytic layer 13. The carbon nanotubes 14a, which grew from catalyst layer 13a on the side surfaces of the recessed part 12 extended in a transverse direction (a direction parallel to the surface of the substrate), and, then, bowed in an upward direction. It was found that the thus-formed carbon nanotubes 14a form a high-density bundle 14 of carbon nanotubes together with the carbon nanotubes 14a grew upward from the catalytic layer 13b on a bottom surface of the recessed part 12, which extremely increases the density of carbon nanotubes as compared to the conventional carbon nanotubes formed on the flat catalytic layer.

FIG. 2B shows a photograph taken by an SEM in a slanting direction from above a carbon nanotube structure having the same structure as the carbon nanotube structure shown in FIG. 2A. FIG. 2B shows that the carbon nanotubes 14a, which grew from catalytic layer 13a on the side surfaces of the recessed part, extended in a transverse direction toward a center, and, then, extended further upward, and the carbon nanotubes 14a are brought into intimately contact with the carbon nanotubes 14a, which grew from the catalytic layer on the bottom surface of the recessed part in a self-assembled manner, which results in a high-density carbon nanotube bundle at the end part 14c.

In a case where the recessed part is a hole having a depth h and a circular bottom surface with a radius r, if it is assumed that number a of carbon nanotubes grow in a unit area of the catalytic layer, the total number of carbon nanotubes that grow from the recessed part is calculated as $\pi r^2 a$ (bottom)+$2\pi rha$ (side). On the other hand, the number of the carbon nanotubes which grow from the catalytic layer formed in the conventional circular shape having a radius r is $\pi r^2 a$. Here, if it is supposed that the radius r=0.65 micrometers and the depth h=0.3 micrometers, a ratio of numbers of carbon nanotubes (the present invention/conventional) is 1.9. That is, the density of the carbon nanotubes of the carbon nanotube structure according to the present invention is 1.9 times that of the conventional one, which means that the electric resistance is 1/1.9.

Thus, according to the present invention, the density of carbon nanotube bundle can be improved and it is possible to provide a carbon nanotube structure, a semiconductor device and a semiconductor package, which can reduce an electric resistance and a thermal resistance.

First Embodiment

Figure 3A:
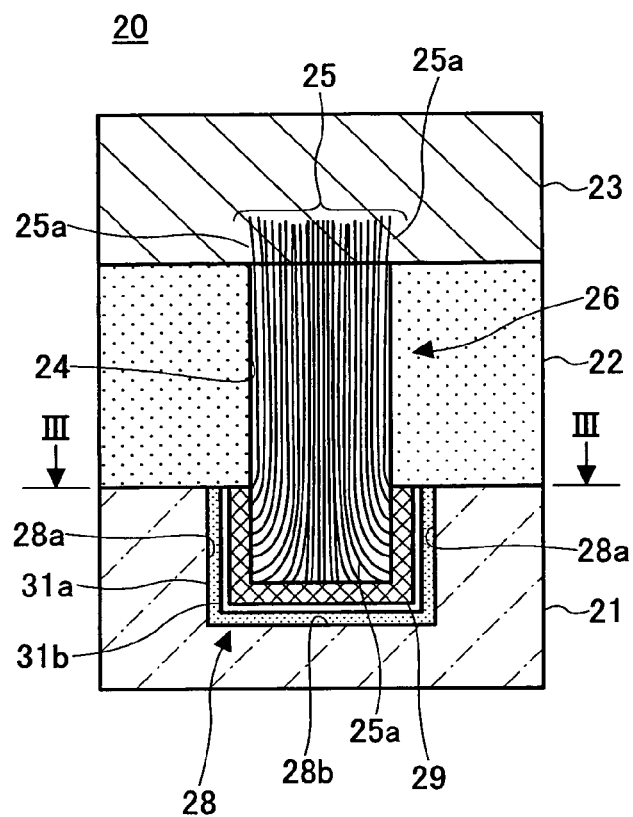
FIG. 3A is a cross-sectional view of a part of a semiconductor device according to a first embodiment of the present invention.
Figure 3B:
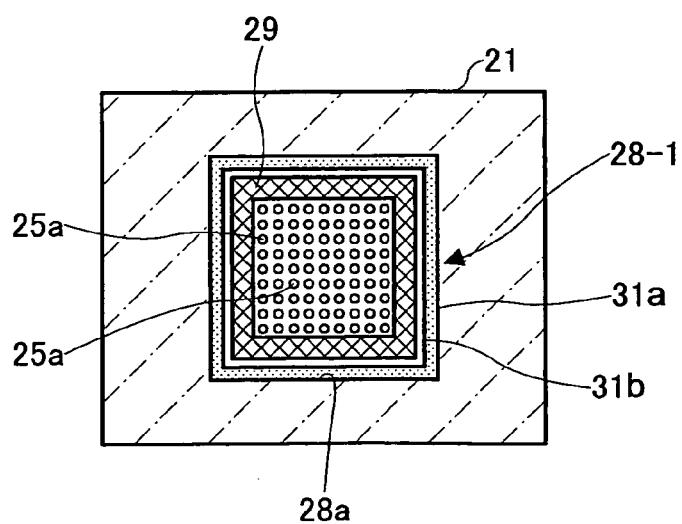
FIG. 3B is a cross-sectional view taken along a line III-III of FIG. 3A.

A description will now be given, with reference to FIGS. 3A and 3B, of a first embodiment of the present invention. FIG. 3A is a cross-sectional view of a part of a semiconductor device according to the first embodiment of the present invention. FIG. 3B is a cross-sectional view taken along a line III-III of FIG. 3A.

With reference to FIGS. 3A and 3B, the semiconductor device 20 according to the first embodiment of the present invention comprises a first wiring layer 21, an inter-layer insulating film 22, a second wiring layer 23, which are sequentially stacked on one on anther. A via hole 24 extends through the inter-layer insulating film 22, and a carbon nanotube bundle 25 is formed in the via hole 24 so as to electrically connecting the first wiring layer 21 and the second wiring layer to each other. The surface of the first wiring layer 21 exposed in the via hole 24 is provided with a recessed part 28. A catalytic layer 29 for growing carbon nanotubes 25a is provided via a barrier layer 31a and a Ti film 31b. The carbon nanotubes 23a extend upward through a via 26 to form the carbon nanotube bundle 25.

The first wiring layer 21 and the second wiring layer 23 are composed of conductive materials selected from a group consisting of Cu, Ti, W, Al, TiN and an alloy containing the aforementioned metal, or stacked film of such a conductive film.

There is no limitation in a material of the inter-layer insulation film 22, and, the inter-layer insulation film 22 is made of, for example, a silicon oxide film having a thickness of 300 nm. The inter-layer insulation film 22 can be a silicon oxide film produced according to a sputtering method, a silicon oxide film according to TEOS (tetra ethoxy silane) gas, a BPSG (boro-phospho silicate glass) film, or an SICO (siloxane alkoxy base) film. It should be noted that an SOD (spin on dielectric) of inorganic material of siloxane base or organic material, or a low-k film of an organic material such as a poly allyl ethyl may be used for the inter-layer insulation film 22.

Each of the carbon nanotubes 25a constituting the carbon nanotube bundle 25 can be either one of a monolayer carbon nanotube (SWCNT) and a multilayer carbon nanotube (MWCNT). Moreover, each of the carbon nanotubes 25a is preferably has a diameter of 0.4 nm-50 nm. If the diameter is larger than 50 nm, a rigidity of the carbon nanotube itself is excessive, which makes the carbon nanotubes 25a, which grow from the side surface of the recessed part, difficult to bend upward. The growth mode of the carbon nanotube 25a can be a root growth mode in which the carbon nanotube 25a grows while the catalytic layer 29 remains at the root thereof, or an end growth mode in which the carbon nanotube 25a grows in a state where the catalytic layer 29 changes into a file particle and exists at an extreme end of the carbon nanotube 25a. In the case of the root growth mode, the catalytic layer 29 remains at the root of the carbon nanotube 25a after the carbon nanotube grew. On the other hand, in the case of the end growth mode, the catalytic layer 29, which is in a fine particle form, remains at the end of the carbon nanotube 25a and the catalytic layer 29 rarely remains at the root of the carbon nanotube 25a. A contact resistance between the first wiring layer 21 and the carbon nanotube 25a in the root growth mode, that is, in a state where the catalytic layer 29 remains, is lower than that in the end growth mode, and it is preferable with respect to the adhesion strength being larger.

It should be noted that the growth mode can be appropriately selected depending on the material of the catalytic layer 29 and conditions of growth.

A barrier layer 31a and a Ti film 31b are provided, in that order, to cover the surfaces of the recessed part 28 of the first wiring layer 21. The barrier layer 31a is made of, for example, Ta, TaN or TiN having a thickness of 5 nm, and prevents Cu from being diffused into the catalytic layer 29 when the first wiring layer 21 is made of Cu. If the first wiring layer 21 is made of a material other than Cu, for example, is it made of Al, the barrier layer may be omitted. Additionally, the Ti film 31b has a thickness of, for example, 1 nm so as to improve the density of the carbon nanotubes 25a growing from the catalytic layer 29. The Ti film 31b is not necessarily provided.

The catalytic layer 29 is provided in the recessed part 28 so as to cover the inner surfaces of the recessed part 28 via the barrier layer 31a and the Ti layer 31b. The catalytic layer 29 has a thickness of, for example, 0.1 nm to 5.0 nm, and is formed a metal material selected from a group consisting of Fe, Ni, Co, Mo and Pd and an alloy containing the aforementioned, or a metal compound containing the metal material and P or N. There is no limitation to the material of the catalytic layer 29, and any known material may be used. The catalytic layer 29 may be a continuous layer or formed as an island-like deposit, or may be formed in a combination of the continuous layer and the island-like deposit.

The recessed part 28 is provided on the surface of the first wiring layer 21, and has a rectangular cross section parallel to the surface of the first wiring layer 21. The recessed part 28 has side surfaces 28a and a bottom surface 28b, which are covered by the above-mentioned catalytic layer 29 via the above-mentioned barrier layer 31a and the Ti film 31b. The carbon nanotube 25a grows from the inner surfaces of the recessed part 28, that is, from the catalytic layer 29 of the side surfaces 28a and the bottom surface 28b of the recessed part. The carbon nanotubes 25a, which grow from the catalytic layer 29 of the bottom surface 28b, extend substantially upward. Oh the other hand, the carbon nanotubes 25a, which grow from the catalytic layer 29 of the side surfaces 28a, extend in a direction perpendicular to the side surfaces 28b, that is, a transverse direction, near the surface of the catalytic layer 29, and, thereafter, the carbon nanotubes 25a bend and extend upward along the carbon nanotubes extending from the bottom surface. Accordingly, the carbon nanotube bundle 25 forming the via 26 has a density of carbon nanotubes in a cross section parallel to the surface of the first wiring layer 21 extremely higher than that of a conventional case in which the flat catalytic layer is formed.

It is preferable that the aspect ratio (=length/depth of one side) of a length of one side of an opening part 28-1 formed by the four side surfaces 28a of the recessed part 28 (a length of one side in a case that the opening part 28-1 is assumed to be a square of the same area) to the depth of the recessed part 28 is set within a range of 0.025 to 10. If the aspect ratio is greater than 10, the depth is excessively large and the carbon nanotubes 25a growing from the bottom surface 28 are difficult to reach the opening part 28-1. On the other hand, if the aspect ratio is smaller than 0.025, a rate of increase in the density of carbon nanotubes is less than 10%, which provides less effect. It should be noted that since the thickness of the catalytic layer 29 is extremely small as compared to the size of the opening part 28a, the opening part 28-1 of the recessed part 28 is regarded as an opening part including the catalytic layer 28, if it is not specifically mentioned.

The configuration of the opening part 28-1 of the recessed part 28 is formed in a configuration the same as the cross section of the via hole 24, that is, for example, a rectangular shape. Additionally, the area of the opening part 28-1 of the recessed part 28 may be wither larger or smaller than the cross-sectional area of the via hole 24. In respect of the density in the carbon nanotube bundle 25, it is preferable that the area of the opening part 28-1 is larger than the cross-sectional area of the via hole 24. In such a case, the carbon nanotube bundle 25 is squeezed, and the density of the carbon nanotubes 25a in the via hole 24 is increased.

It is preferable that a ratio of the surface area Scat of the catalytic layer 29 of the surface of the recessed part 28 to the area Svia of the cross section of the via hole 24 is within a range 0.05 to 10 (Scat/Svia=0.05 to 10). If the ratio Scat/Svia is larger than 10, the rate of increase in the density of carbon nanotubes is less than 10%, which provides less effect. On the other hand, if the ratio is smaller than 0.05, the carbon nanotubes 25a growing from the bottom surface 28b are difficult to reach the opening part 28-1.

FIGS. 4A through 4D are enlarged cross-sectional view of parts of semiconductor devices, which are variations of the first embodiment of the present invention. In each of FIGS. 4A through 4D, only a part near the recessed part is shown, and other parts are omitted since they are the same as the parts shown in FIG. 3A. In FIGS. 4A through 4D, parts that are the same as the parts shown in FIGS. 3A and 3B are given the same reference numerals, and description thereof will be omitted.

Figure 4A:
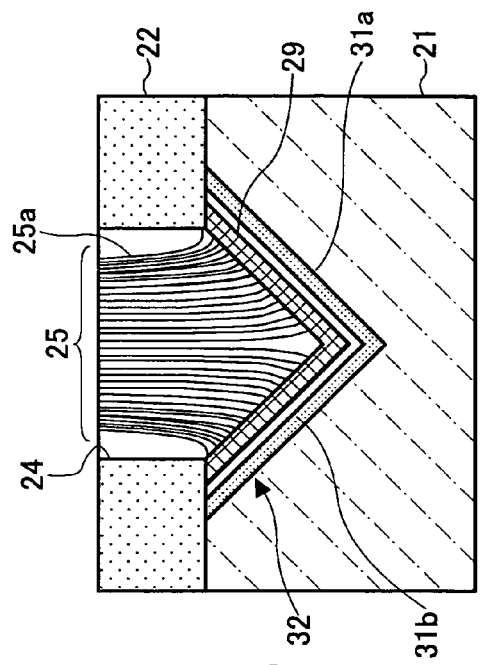
FIGS. 4A through 4D are enlarged cross-sectional view of parts of semiconductor devices, which are variations of the first embodiment of the present invention.

With reference to FIG. 4A, a recessed part 30 of the first wiring layer of the semiconductor device has a semielliptic cross section parallel to the surface of the first wiring layer 21. In this case, among the carbon nanotubes 25a growing from the surface of the catalytic layer 29, the carbon nanotubes 25a, which grow from a periphery of the semielliptic recess, extend in the transverse direction and subsequently extend upward along the carbon nanotubes 25a, which grow upward from a center portion of the recessed part 30. The surface area of the catalytic layer 29 is larger than the case where the catalytic layer 29 is flat. As a result, the density of the carbon nanotubes 25a in the cross section parallel to the surface of the first wiring layer 21 is increased. The same applies to recessed parts shown in FIGS. 4B through 4D.

Figure 4B:
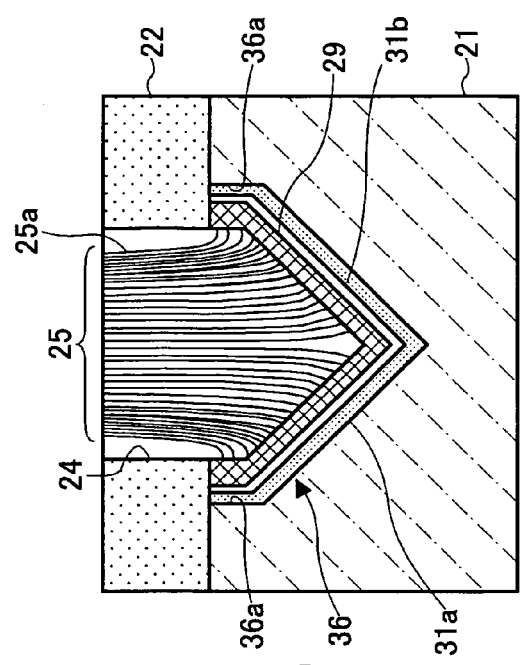

Additionally, referring to FIG. 4B, the recessed part 32 is a V-shaped groove. Thus, the carbon nanotubes 25a growing from the catalytic layer 29 formed on slanting surfaces grow and extend upward, and assemble together and extend further upward.

Figure 4C:
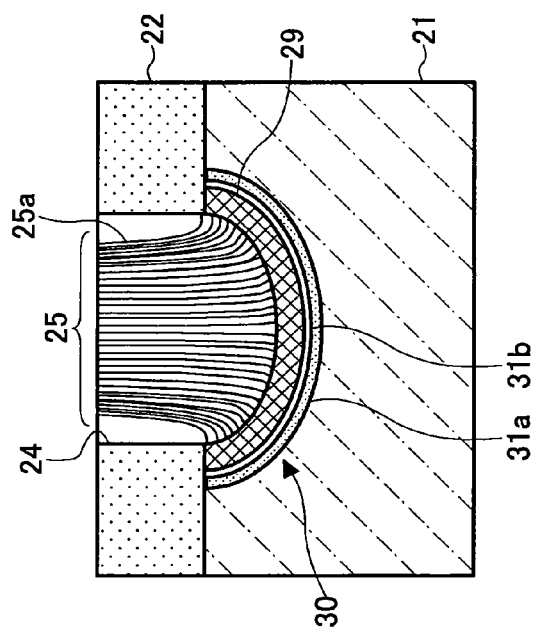
Figure 4D:
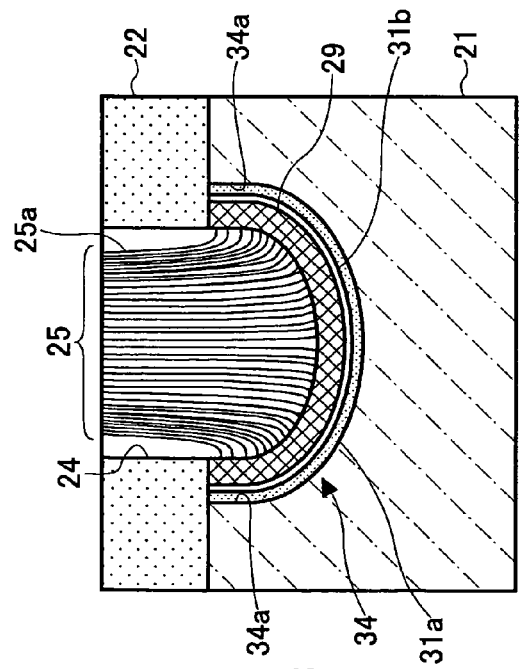

Referring to FIGS. 4C and 4D, the recessed parts 34 and 36 have the same configurations as that shown in FIGS. 4A and 4B except for side surfaces 34a and 36a, which are perpendicular to the surface of the first wiring layer 21, provided near the surface of the first wiring layer 21, respectively. As a result, an area of the catalytic layer 29 is increased, which further increases the density of the carbon nanotubes 25a in a cross area parallel to the first wiring layer 21.

It should be noted that, although it is not shown in figures, the recessed part may have a reversed conical shape in which a cross section perpendicular to the surface of the first wiring layer 21 has the same configuration as that shown in FIG. 4B and a cross section parallel to the surface of the first wiring layer 21 has a circular shape or an elliptic shape. Alternatively, the recessed part may have a shape having a cross section such as shown in FIG. 4C and a cross section parallel to the surface of the first wiring layer 21 is a square shape. Additionally, the recessed part may have a configuration which is a combination of the above-mentioned configurations. Further, the cross section perpendicular to the surface of the first wiring layer 21 may be a reversed trapezoid. In such as case, the area of the catalytic layer 29 can be increased with respect to the cross-sectional area parallel to the first wiring layer 21, which increases the density of the carbon nanotubes 25a.

A description will now be given of a manufacturing method of the semiconductor device according to the first embodiment of the present invention.

Figure 5A:
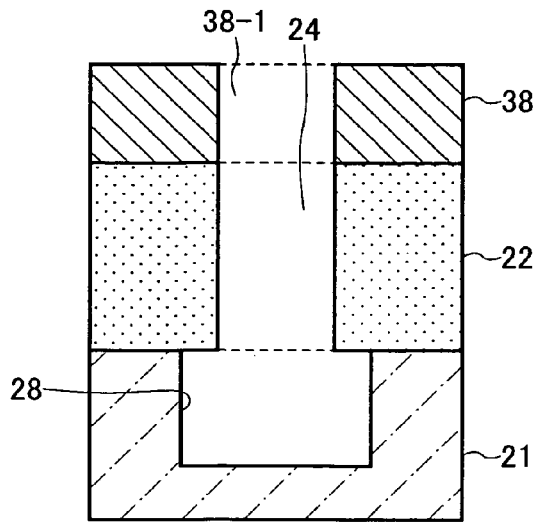
FIGS. 5A through 5C are cross-sectional views of a part of the semiconductor device according to the first embodiment in a manufacturing process thereof.
Figure 5B:
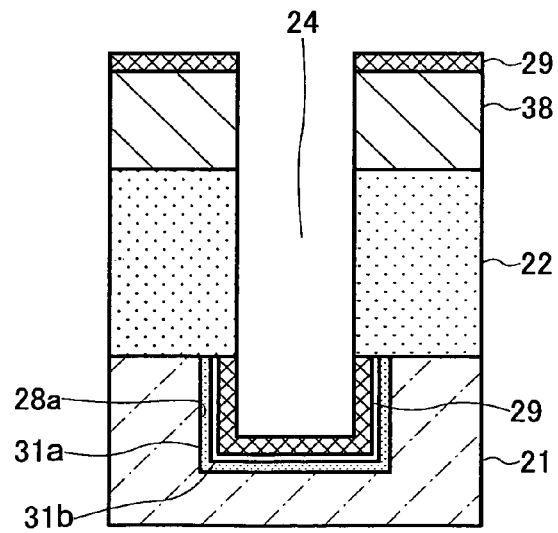
Figure 5C:
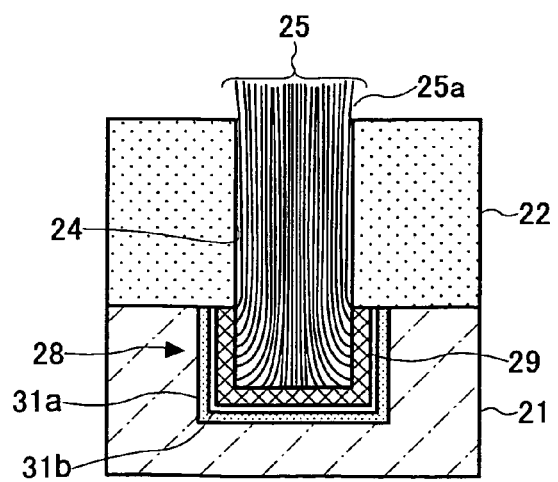

FIGS. 5A through 5C are cross-sectional views of a part of the semiconductor device according to the first embodiment in a manufacturing process thereof. First, in a process shown in FIG. 5A, the first wiring layer 21 is formed as a solid film made of Cu, Ti, W, etc., according to a sputtering method, a CVD method, an electroplating method, an electroless plating method, etc. Then, although illustration is omitted, a wiring pattern is formed by etching the first wiring layer 21. It should be noted that when the first wiring layer is formed according to the damascene method, a wiring groove is formed in an insulation film, which is a base of the first wiring layer; a metal seed layer (for example, a stacked material of Ti film/TiN film) if formed according to a sputtering method; fill Cu into the wiring groove using an electroplating method; and a surface of the Cu film is planarized according to a chemical mechanical polishing (CMP) method.

In the process of FIG. 5A, further, the inter-layer insulation film 22 having a thickness of, for example, 300 nm is formed using the material mentioned above by the spatter, CVD, etc., so as to cover the first wiring layer 21. The inter-layer insulation film 22 is made of the above-mentioned material, for example, a silicon oxide film.

In the process of FIG. 5A, further, a resist film 38 which covers the inter-layer insulation film 22 is formed, and an opening part 38-1 is formed in the resist film 38 by exposing and developing the pattern of a via.

In the process of FIG. 5A, further, the via hole 24 is formed by an RIE method so as to expose a part of the surface of the first wiring layer 21 by using a resist film 38-1 as a mask and using, if the inter-layer insulation film 22 is a silicon oxide film, a mixture gas of $CF_4$ and $H_2$.

In the process of FIG. 5 (A), further, the first wiring layer 21 is etched by ion milling using Ar ions or an RIE method by using the resist film 38 as a mask so as to form the recessed part 28. It is preferable to control the etching by controlling degrees of anisotropy etching and isotropic etching according to kinds of etching gases and a mixture ratio thereof in response to the configuration of the recessed part 28. It should be noted that if the first wiring layer 21 is made of Cu, the recessed part 28 is formed according to wet-etching using, for example, a ferric chloride water solution. The size of the recessed part 28 is controlled by etching time.

Subsequently, in the process of FIG. 5B, the barrier layer 31a of the above-mentioned material having a thickness of 5 nm and a Ti film having a thickness of 1 nm are formed on the inner surface of the recessed part according to a sputtering method, a CVD method and the like using the resist film 38 as a mask, and, then, the catalytic layer 29 having a thickness of, for example, 5 is formed.

Subsequently, in the process of FIG. 5C, the resist film 38 in the structure shown in FIG. 5B is removed, and, then, the carbon nanotubes 25a are formed on the surface of the catalytic layer 29 using a CVD method or an SiC sublimating method. Specifically, using a thermal CVD apparatus, acetylene gas (flow of 20 sccm) and argon gas (flow of 180 sccm) are supplied into a container; a pressure in the container is set to 1 kPa; a current (about 10 A) is supplied to a hot filament facing the structure; and the structure is heated at 400° C. to 600° C. with a processing time being set to 1 minute to 15 minutes so as to form the carbon nanotubes 25a. The carbon nanotube bundle 25 is caused to grow to a degree that the carbon nanotubes 25a, which grow from the catalytic layer 29 of the side surface of the recessed part 28 in a transverse direction extend upward together with the carbon nanotubes 25a, which grow from the catalytic layer 29 of the bottom surface, until the carbon nanotubes 25a protrude from the via hole 24.

Then, in a process subsequent to the process of FIG. 5C, the second wiring layer 23, which covers the inter-layer insulation film 22 and the carbon nanotube bundle 25, is formed in the same manner as the first wiring layer 21, and, thus, the semiconductor device 20 shown in FIG. 20A is formed. According to the present embodiment, since the first wiring layer 21 and the second wiring layer 23 of the semiconductor device 20 are connected by the carbon nanotube bundle 25 having a higher density than the conventional one, a maximum electric current permitted by the via 26 can be increased, which permits a reduction in the cross-sectional area of the via 26.

Moreover, since an electric resistivity of the via 26 can be reduced and also a CR delay can be controlled according to the present embodiment, a transmission rate can be increased. Further, since the semiconductor device 20 can be miniaturized and elements can be highly integrated in association with the reduction in size of a cross section of the via 26, the transmission rate can be further increased. Additionally, since an area in which the carbon nanotubes 25a contact the first wiring layer 21 is increased by providing the recessed part 28 to the first wiring layer 21, a maximum allowable current between the first wiring layer 21 and the second wiring layer 23 can be increased.

It should be noted that although the via 26 is explained as an example in the above explanation, the present invention is applicable to a case of a silicide film formed on a silicon substrate or a gate electrode instead of the first wiring layer 21, that is, a case of a contact.

Figure 6:
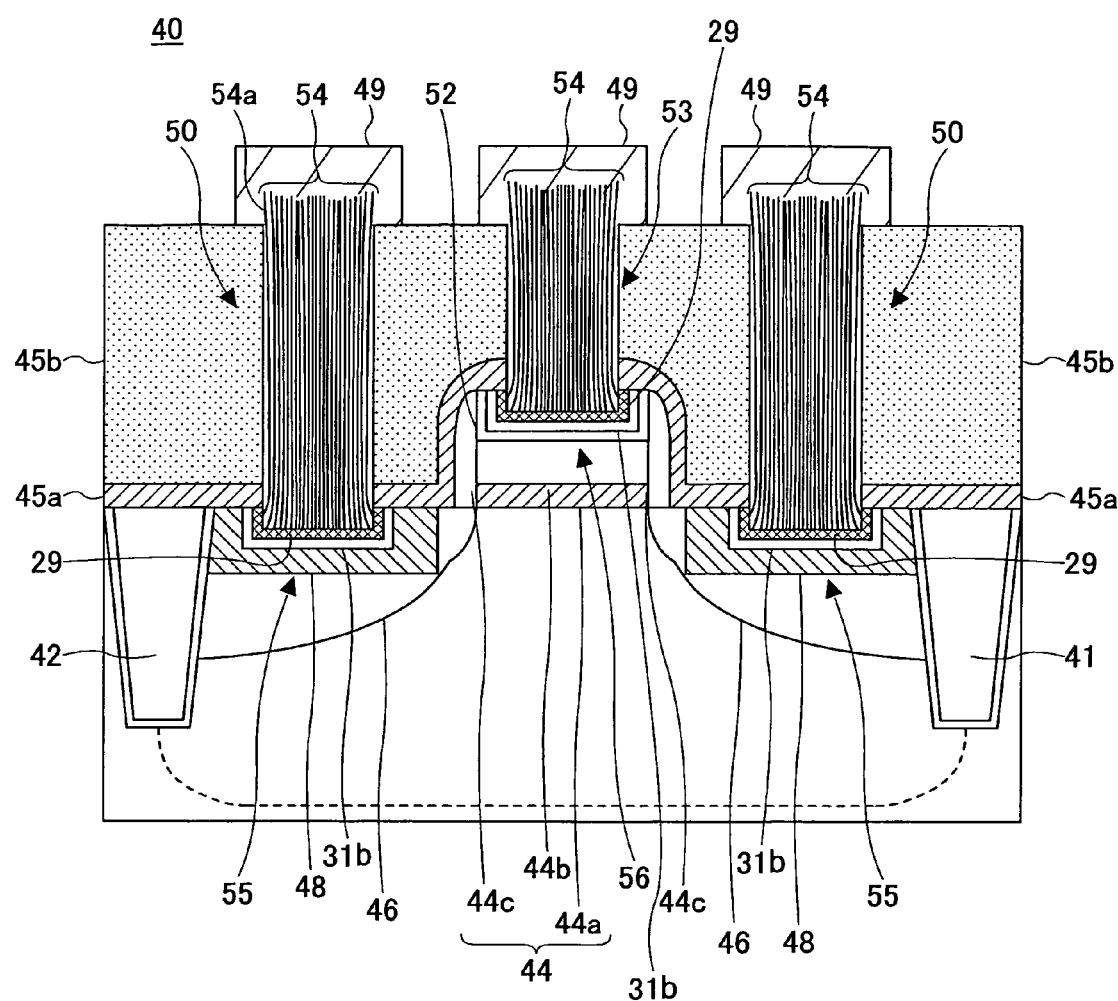
FIG. 6 is a cross-sectional view of a part of a semiconductor device, which is a variation of the first embodiment of the present invention.

FIG. 6 is a cross-sectional view of a part of the semiconductor device, which is a variation of the first embodiment of the present invention. In FIG. 6, parts that are the same as the parts previously explained are given the same reference numerals, and descriptions thereof will be omitted.

Referring to FIG. 6, the semiconductor device 40 comprises: a silicon substrate 41; a gate stacked part including a gate oxide film 44a, a gate electrode 44b and a sidewall insulation film 44c that are formed in an element area 43 defined by an element separation area 42 on the silicon substrate 41; a silicon nitride film 45a and an inter-layer insulation film 45b that cover the surface of the silicon substrate 42 and the gate stacked part 44; contacts 50 extending through the inter-layer insulation film 45b and the silicon nitride film 45a and contact with silicide films 48 formed in source-drain areas 46 and also electrically connected to wiring patterns 49; and a contact which is in contact with a silicide film of the gate electrode 44c and also electrically connected to a wiring pattern 49.

The semiconductor device 40 according to the present embodiment has a structure in which the contacts 50 and 53 are electrically connected to the source-drain areas 46 and the gate electrode 44c. The gate stacked part 44 and the inter-layer insulation film 45b are made of known materials, and description thereof will be omitted.

Each of the contacts 50 and 53 is composed of a carbon nanotube bundle 54. Recessed parts 55 and 56 are provided in the silicide films 48 and 52, and each of the carbon nanotube bundles are formed of the carbon nanotubes 54a that grow and extend from the catalytic layers 29 covering the inner surfaces of the recessed parts 55 and 56 via the Ti film 31b. Each of the contacts 50 and 53 can be a structure the same as the via shown in FIG. 3A and FIGS. 4A through 4C. Ti film 31b may be eliminated if it is not necessary.

It should be noted that the silicide films 48 and 52 can be etched by wet-etching or, instead, plasma etching or a RIE method may be used. A depth of the recessed parts 55 and 56 is preferably smaller than the thickness of the silicide films 48 and 52 so as to suppress an increase in a contact resistance. It should be noted that although illustration is omitted, the surfaces of the recessed parts may be applied with siliciding after the recessed parts are formed in the silicon substrate 41, or silicide films may be formed on the surfaces of the recessed parts.

Since the source-drain areas 46 and wiring patterns 49 are connected by the contacts 50 and 53 filed with the carbon nanotube bundles 54 having a high density, similar to the via in the above-mentioned embodiment, a drain current of the semiconductor device 40 can be increased, which enables a reduction in the cross-sectional area (size). Moreover, according to the present embodiment, an electric resistivity of the contacts can be reduced and a CR delay can be suppressed, and, thus, a high-sped transmission can be achieved. Further, the semiconductor device can be miniaturized and highly integrated, which results in a further high-speed transmission.

It should be noted that when forming the carbon nanotubes 54a in the silicon substrate 41, the recessed parts 55 may be formed using crystallographical plane anisotropic etching. An alkaline solution such as KOH, $N_2H_4$, $NH_2(CH_2)_2NH_2$, $NH_4OH$, etc., may be used as an etchant. Moreover, the above-mentioned carbon nanotubes can be used as a through electrode, which connects wiring patterns formed on front and back surfaces of a silicon substrate.

Example

After forming a Cu film used as a lower electrode on a silicone substrate, a silicone oxide film covering the Cu film was formed. An opening part having a diameter of 2 μm was formed on the silicon oxide film. A recessed part having a diameter of 2 μm and a depth of 350 nm was formed in the Cu film, the recessed part being connected to the opening part. Then, a Ta film (thickness of 5 nm), a Ti film (thickness of 1.5 nm) and a catalytic layer (thickness of 2.5 nm) were sequentially formed on the surface of the recessed part according to a sputtering method. Then, using a thermal CVD apparatus, acetylene gas (flow of 20 sccm) and argon gas (flow of 180 sccm) were supplied and a pressure was set to 1 kPa so as to cause carbon nanotube bundle having a length of about 2000 nm growing from the catalytic layer. Thereafter, a Cu film was formed at an end of the carbon nanotube bundle by a sputtering method to provide an upper electrode. An electric resistance of the carbon nanotube bundle between the lower electrode and the upper electrode was measured by a tow-terminal method.

Example for Comparison

For the purpose of comparison, a carbon nanotube bundle was formed in the same manner as the above-mentioned example except for forming the Ta film (thickness of 5 nm), the Ti film (thickness of 1 nm) and the catalytic layer (thickness of 2.5 mm) by sequentially stacking in that order without forming a recessed part in the Cu film. Then an electric resistance of the thus-formed carbon nanotube bundle was measured.

Comparing the example and comparative example, the electric resistance of the comparative example was 42Ω while electric resistance of the carbon nanotube structure of the example was 7Ω, and it was confirmed that the electric resistance can be reduced to ⅙. As mentioned above, it was found that a density of the carbon nanotubes can be increased by forming a recessed part on the Cu film, which reduces an electric resistance.

Figure 7A:
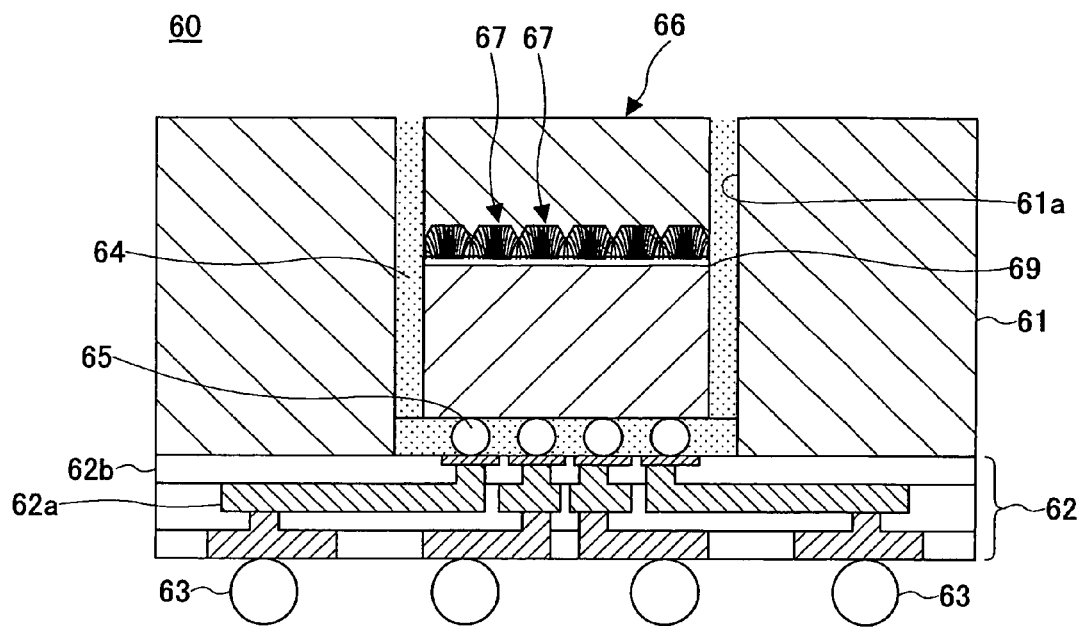
FIG. 7A is a cross-sectional view of a semiconductor package according to a second embodiment of the present invention.
Figure 7B:
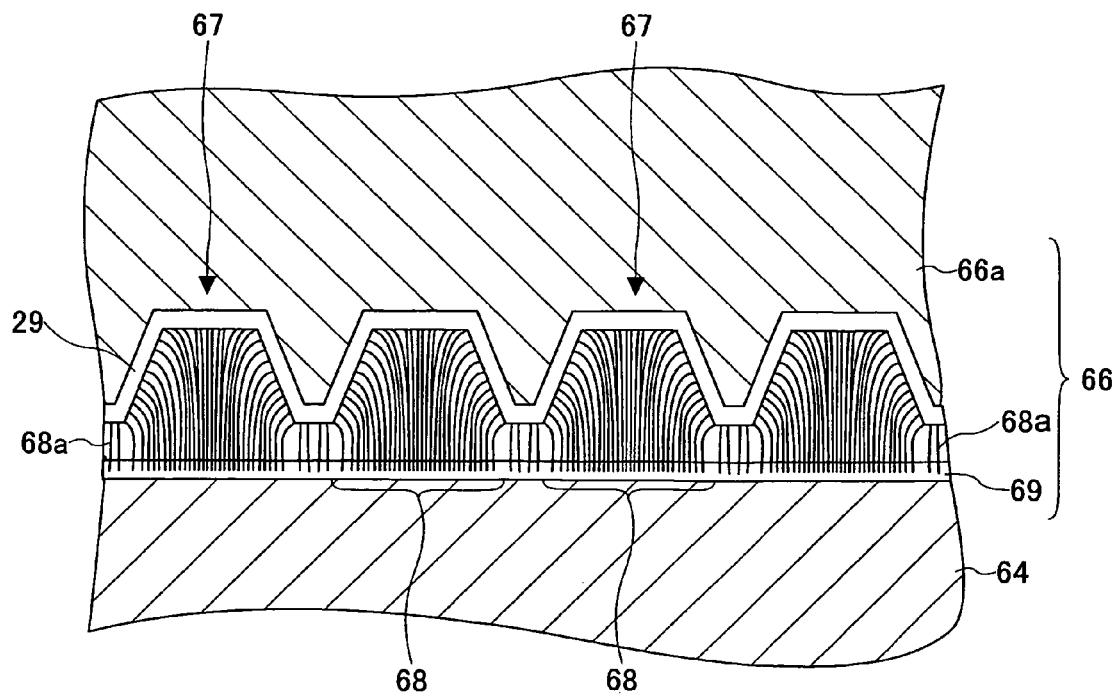
FIG. 7B is an enlarged view of a part of FIG. 7A.

A description will now be given, with reference to FIGS. 7A and 7B, of a second embodiment of the present invention. FIG. 7A is a cross-sectional view of a semiconductor package according to the second embodiment of the present invention. FIG. 7B is an enlarged view of a part of FIG. 7A.

With reference to FIGS. 7A and 7B, the semiconductor package 60 of the present embodiment comprises: a support substrate 61; a multi-layer wiring layer 62 provided to the support substrate 61; a semiconductor chip 64 located in an opening part 61a provided in the support substrate 61 and electrically connected to the multi-layer wiring layer 62 through bumps 65; and a heat sink 66 located on a surface of the semiconductor chip.

There is no limitation in the materials of the support substrate 61 and the multi-layer wiring layer 62, and known materials may be used. The support plate 61 can be made of a plate material of, for example, Cu, a Cu alloy such as a Cobal (Ni 29%-Co 17%-Fe remainder), Fe, Ni, an FeNi alloy such as a 62-alloy (Ni 42%-Fe remainder), Mo or W, or a clad metal such as Cu/Inber/Cu. The multi-layer wiring layer 62 comprises an insulation layer 62b made of, for example, epoxy resin, polyimide resin of a low dielectric material or a bithmulaid-triasin resin, and a wiring layer 62a made of Cu, a Cu alloy, Al, etc.

A base 66a of the heat sink 66 is formed of a fin shaped material having an excellent thermal conductivity such as Al, an Al alloy, Cu, a Cu alloy, etc. A surface of the semiconductor chip 64 is provided with many recessed parts 67. The catalytic layer 29 is formed on the surfaces of the recessed parts. Carbon nanotube bundles 68, each of which includes many carbon nanotubes 68, are fixed to the catalytic layer 29, and an adhesive layer 69 is provided on ends of the carbon nanotube bundles 68.

The catalytic layer 29 is formed of the same material as the catalytic layer of the first embodiment. Since the catalytic layer 29 is formed along the surfaces of the recessed parts 67 so as to cover the recessed parts 67, the carbon nanotube 68a grow from the side surfaces and the bottom surfaces of the recessed parts 67. Therefore, the density of the carbon nanotube bundles 68 is increased as compared to the case where the carbon nanotube bundles are formed on a flat catalytic layer. It should be noted that the carbon nanotubes 68a are formed in the same manner as the first embodiment mentioned above.

The configuration of each of the recessed parts 67 includes slanting surfaces and a bottom surface as shown in FIG. 7B. Each of the recessed parts can be a groove extending in a direction perpendicular to the drawing sheet, or the recesses parts may be located in a lattice arrangement. Additionally, each of the recessed parts 67 may have a configuration the same as the recessed part explained in the first embodiment, for example, the configuration of the recessed part shown in FIG. 3A and FIGS. 4A through 4D. There is no limitation in the method of forming the recessed parts 67, and a mechanical grinding, a surface processing by wet or dry etching or a die molding may be used.

Although the adhesive layer 69 is made of a thermally conductive material and there is no limitation in the material, it is preferable to use a low melting point metal such as Au, Sn or an alloy of the aforementioned. The adhesive layer 69 is formed on each of the ends of the carbon nanotube bundles 68 and a surface of the semiconductor chip 64 by a vapor deposition method with a thickness of 500 nm, and both the adhesive layers 69 are brought into contact with each other and heated so as to be fixed to each other.

According to the present embodiment, since the heat sink 66 thermally connected to the semiconductor chip 64 has the high-density carbon nanotube bundles 68 in the semiconductor package 60, a thermal resistance is reduced and a thermal conductivity is improved. As a result, a release of heat of the semiconductor chip 64 is effectively performed, which prevents an erroneous operation due to an excessive heating and suppresses a reduction in the service life, thereby improving reliability.

It should be noted that the structure of the semiconductor package is not limited to the above-mentioned embodiments.

The present invention is not limited to the specifically disclosed embodiments, and variations and modifications may be made without departing from the scope of the present invention.

The present application is based on priority Japanese application No. 2004-292843 filed Oct. 5, 2004, the entire contents of which are hereby incorporated herein by reference.

What is claimed is:

1. A semiconductor device comprising:
   a first electrically conductive material having a recessed part that is indented from a surface of said first electrically conductive material;
   a catalytic layer covering a side wall of the recessed part and a bottom part of the recessed part;
   an insulation film covering said first electrically conductive material;
   a plurality of carbon nanotubes extending through said insulation film by being filled in an opening part that exposes said recessed part, the carbon nanotubes electrically connecting said first electrically conductive material and said second electrically conductive material to each other; and
   a second electrically conductive material covering on said insulation film and the plurality of carbon nanotubes,
   wherein ends of said carbon nanotubes are fixed to the catalytic layer covering the side wall and the bottom wall of the recessed part,
   wherein opposite ends of said carbon nanotubes are protected from said insulation film and buried in said second electrically conductive material,
   wherein said recessed part has a cross section parallel to the surface of said first electrically conductive material and having a configuration selected from the group consisting of a V-shape, an elliptic shape, a trapezoidal shape and a reversed trapezoidal shape, and
   wherein said carbon nanotubes extending from the catalytic layer covering the side wall of said recessed part first extend in a direction perpendicular to said side wall and then extend in a direction to go through said opening part of said insulation film.

2. The semiconductor device as claimed in claim 1, wherein said recessed part has a side surface substantially perpendicular to the surface of said first electrically conductive material.

3. The semiconductor device as claimed in claim 1, further comprising a barrier film and a Ti film between an inner surface of said recessed part and said catalytic layer so as to cover the inner surface of said recessed part.

4. The semiconductor device as claimed in claim 1, wherein said catalytic layer is one of a continuous layer and a particulate deposit.

5. The semiconductor device as claimed in claim 1, wherein said catalytic layer is made of a material selected from the group consisting of Fe, Ni, Co, Mo, Pd and an alloy containing one of the aforementioned metal and a metal compound containing the metal material and P or N.

6. The semiconductor device as claimed in claim 1, wherein an aspect ratio of a length of one side of an opening part of said recessed part to a depth of said recessed part is set in a range from 0.025 to 10.

7. The semiconductor device as claimed in claim 1, wherein a ratio Scat/Svia of a surface area Scat of said catalytic layer to an area Svia of a cross section parallel to the surface of said electrically conductive material is set in a range from 0.05 to 10.

8. The semiconductor device as claimed in claim 1, wherein said first electrically conductive material and said second electrically conductive material are formed of an electrically conductive material selected from Cu, Ti, W, Al, TiN and an alloy containing the aforementioned metal or a stacked film of the aforementioned electrically conductive materials.

9. A semiconductor device comprising:
   a semiconductor device; and
   a heat-releasing part of a surface of said semiconductor device,
   wherein said heat-releasing part includes a thermally conductive base material, a plurality of carbon nanotubes arranged on a surface of the thermally conductive base material and an adhesive layer fixing ends of said carbon nanotubes to said semiconductor device, and wherein ends of said carbon nanotubes are fixed to a catalytic layer covering a side wall and a bottom wall of a recessed part that is indented from the surface of said thermally conductive base material, and wherein opposite ends of said carbon nanotubes are buried in said adhesive layer,
   wherein said adhesive layer covers the thermally conductive base material and the recessed part,
   wherein said recessed part has a cross section parallel to the surface of said first electrically conductive material and having a configuration selected from the group consisting of a V-shape, an elliptic shape, a trapezoidal shape and a reversed trapezoidal shape, and
   wherein said carbon nanotubes extending from the catalytic layer covering the side wall of said recessed part first extend in a direction perpendicular to said side wall and then extend in a direction to go through said opening part of said insulation film.

10. The semiconductor device as claimed in claim 9, wherein said carbon nanotubes grow from said catalytic layer.

11. The semiconductor device as claimed in claim 9, wherein said adhesive layer is made of a material selected from a group consisting of Au, Sn and an alloy containing one of the aforementioned material.

12. A carbon nanotube structure comprising:
   a base material;
   a catalytic layer covering a side wall and a bottom wall of a recessed part that is indented from a surface of said base material;
   a plurality of carbon nanotubes growing from a surface of said catalytic layer; and
   a covering layer covering the base material and the recessed part,
   wherein ends of said carbon nanotubes are fixed to the catalytic layer covering the side wall and the bottom wall of the recessed part,
   wherein opposite ends of said carbon nanotubes are buried in said covering layer,
   wherein said recessed part has a cross section parallel to the surface of said first electrically conductive material and having a configuration selected from the group consisting of a V-shape, an elliptic shape, a trapezoidal shape and a reversed trapezoidal shape, and wherein said carbon nanotubes extending from the catalytic layer covering the side wall of said recessed part first extend in a direction perpendicular to said side wall and then extend in a direction to go through said opening part of said insulation film.

13. The carbon nanotube structure as claimed in claim 12, wherein said carbon nanotubes form a carbon nanotube bundle in which ends of said carbon nanotubes are cohesive with each other.

14. The semiconductor device as claimed in claim 9, further comprising a circuit substrate connected to said semiconductor device.

15. A heat sink comprising:
- a thermally conductive base material having a recessed part on a surface, the recessed part being dented inwardly from a surface of the electrically conductive base material;
- a plurality of carbon nanotubes fixed to a catalytic layer covering a side wall and a bottom wall of the recessed part; and
- a covering layer covering the thermally conductive base material and the recessed part,
- wherein ends of said carbon nanotubes are fixed to the catalytic layer covering the side wall and the bottom wall of the recessed part,
- wherein opposite ends of said carbon nanotubes are buried in said covering layer,
- wherein said recessed part has a cross section parallel to the surface of said first electrically conductive material and having a configuration selected from the group consisting of a V-shape, an elliptic shape, a trapezoidal shape and a reversed trapezoidal shape, and
- wherein said carbon nanotubes extending from the catalytic layer covering the side wall of said recessed part first extend in a direction perpendicular to said side wall and then extend in a direction to go through said opening part of said insulation film.

16. The semiconductor device as claimed in claim 1, wherein said side wall of said recessed part is substantially perpendicular to the surface of said first electrically conductive material.

17. The semiconductor device as claimed in claim 1, wherein said recessed part is a cavity formed by processing the surface of said first electrically conductive material.

18. The semiconductor device as claimed in claim 17, wherein said cavity is formed by etching.

* * * * *